United States Patent [19]
Okuda et al.

[11] Patent Number: 5,633,512
[45] Date of Patent: May 27, 1997

[54] SEMICONDUCTOR DEVICE FOR VARYING THE MOBILITY OF ELECTRONS BY LIGHT IRRADIATION

[75] Inventors: Masahiro Okuda; Hitoshi Oda, both of Sagamihara, Japan

[73] Assignee: Canon Kabushiki Kaisha, Tokyo, Japan

[21] Appl. No.: 113,516

[22] Filed: Aug. 30, 1993

Related U.S. Application Data

[63] Continuation of Ser. No. 704,267, May 22, 1991, abandoned.

[30] Foreign Application Priority Data

May 23, 1990 [JP] Japan ................................. 2-133581
May 24, 1990 [JP] Japan ................................. 2-134727

[51] Int. Cl.$^6$ ................................. H01L 29/205
[52] U.S. Cl. ................... 257/20; 257/21; 257/192
[58] Field of Search ..................... 357/16, 22, 30; 257/20, 21, 187, 192, 17, 22, 23

[56] References Cited

U.S. PATENT DOCUMENTS

| | | | |
|---|---|---|---|
| 4,163,237 | 7/1979 | Dingle et al. | 357/22 A |
| 4,688,061 | 8/1987 | Sakaki | 357/16 |
| 4,814,836 | 3/1989 | Thompson | 357/22 A |
| 4,894,691 | 1/1990 | Matsui | 357/22 A |
| 5,070,375 | 12/1991 | Sakai | 357/30 E |

OTHER PUBLICATIONS

M. Yamanishi, et al., "Control of Quantum Interference Current Through Exchange Interaction Between Coherent Electron Waves and Photo-Excited Virtual Carriers", *Hiroshima University*, *1989 Science Lecture Conference*, 27P-Z-1, Nov. 27, 1984 (with translation).

B.K. Levine, et al., "New 10 μm Infrared Detector Using Intersubband Absorption in Resonant Tunneling GaAlAs Superlattices", *Applied Physics Letters*, pp. 1092–1094, Apr. 20, 1987.

S. Datta, et al., "Proposed Structure for Large Quantum Interference Effects", *Applied Physics Letters*, pp. 487–489, Feb. 17, 1986.

H. Sakaki, "Velocity-Modulation Transistor (VMT)—A New Field-Effect Transistor Concept", *Japanese Journal Of Applied Physics*, pp. L381–383, Jun. 1986.

*Primary Examiner*—Donald L. Monin, Jr.
*Attorney, Agent, or Firm*—Fitzpatrick, Cella, Harper & Scinto

[57] ABSTRACT

A semiconductor device in which a current is controlled by light includes a semiconductor member having a source unit and a drain unit and a channel unit through which electrons may flow between the source unit and the drain unit. The channel unit has a quantum well layer having a plurality of quantum energy levels and barrier layers provided adjacent to the well layer. Upon light irradiation of the quantum well layer, electrons make transitions between the different quantum energy levels, and the current flowing between the source unit and the drain unit is controlled by varying the mobility of these transitioned electrons.

66 Claims, 10 Drawing Sheets

POLARIZATION DIRECTION

SEMICONDUCTOR DEVICE FOR VARYING THE MOBILITY OF ELECTRONS BY LIGHT IRRADIATION

This application is a continuation of application Ser. No. 07/704,267 filed May 22, 1991, now abandoned.

BACKGROUND OF THE INVENTION

1. Field of the Invention

The present invention relates to a semiconductor device for varying the mobility of electrons by light irradiation. The semiconductor of the present invention can be used as an optical gate transistor or the like which performs the switching of current with a photodetector or optical signal as its gate.

2. Related Background Art

Several types of photodetectors have been proposed.

A pn junction type photodiode is in use. This photodiode modulates optical current by changing the number of carriers such that the pn junction, inversely biased to less than the breakdown voltage, generates electron-hole pairs when receiving electromagnetic irradiation.

In recent years, a photodetector which uses the transition between the sub-bands of a quantum, well as an infrared photodetector has been proposed. FIG. 1A and FIG. 1B, for example, show illustrations of the energy bands of an infrared photodetector of the type proposed in Applied Physics Letter Vol. 50, No. 16, pp. 1092–1094. In this photodetector, an electric field is first applied vertically, i.e., in the horizontal direction in FIG. 1A, to the well face of a multiple quantum well structure 70 which has been processed by doping. If light equivalent to the transition energy between the sub-bands of the quantum well is irradiated onto this photodetector, the electrons which have made a transition from the ground state to the pumping state, as shown in FIG. 1B, penetrate the barrier layer by tunneling and become hot electrons 71 which flow between the well layers. As a result, it becomes possible to detect infrared light, i.e., the light which has photon energy equivalent to the transition energy between the sub-bands.

A velocity modulation transistor (VMT) has been proposed in Japanese Journal of Applied Physics Vol. 1, No. 6, pp. L381–L383. This transistor is capable of performing high-speed switching which exceeds the ultimate limit of velocity of field effect transistors, i.e., a switching faster than the transition time of electrons from the source to the drain. The transistor's structure is such that while maintaining the number of electrons N in the channel at a substantially constant level, the mobility of electrons flowing in the channel, i.e., the velocity, is varied by the voltage applied to the gate to modulate the current between the source and drain. As a result, it becomes possible to execute a high-speed operation independent of the time required to change the number of carriers N, i.e., the transition time of electrons between the source and drain.

However, in the conventional examples mentioned above, the problems set forth below have been encountered.

In the pn junction type photodiode, the response time depends on the RC time constant determined by the capacitance of the pn junction C and the load resistance R, making it difficult for this type of photodiode to respond at high speed.

In a photodetector of the type shown in FIG. 1A and FIG. 1B, a high electric field should be applied to the quantum well structure in advance to prepare hot electrons. Consequently, there exists a considerable amount of current generated by tunneling, the so-called dark current. Moreover, the response time of a detector element of this type is ultimately determined by the transition time during which the optically pumped carriers penetrate between the quantum well layers to reach the electrode. This transition time is estimated at approximately 30 ps. In this respect, although the response time of the VMT is not restricted by the transition time as described earlier, it is still impossible to make its response time sufficiently satisfactory because a voltage should be applied to the gate electrode to modulate the mobility of the electrons. Moreover, the response time of the element is restricted by the RC time constant determined by the gate capacitance C and the series resistance R of the applied voltage supply resistance and channel resistance.

SUMMARY OF THE INVENTION

An object of the present invention is to provide a semiconductor device which enables its current to respond to a light at an extremely high speed by solving the aforesaid problems existing in the conventional art.

The semiconductor device with which to achieve the above-mentioned object comprises:

a semiconductor mender having a source unit and a drain unit; and a channel unit through which electrons may flow between said source unit and drain unit, which comprises a quantum well layer having a plurality of quantum energy levels and barrier layers provided adjacent to this well layer.

Here, upon light irradiation of the quantum well layer, electrons make transitions between the different quantum energy levels, and current flowing between the source unit and drain unit is controlled by the variation of the mobility of these electrons.

In a first embodiment of the present invention, the mobility of electrons is varied by the traveling from the well layer to the barrier layer in actual space of the electrons which have made transitions from a first quantum energy level to a second quantum energy level.

Also, in a second embodiment of the present invention, the quantum well layer is formed to enable the mobility of electrons flowing in the layer to have regions different from each other. Then, the mobility of electrons is varied by the changes in the spatial distribution of the wave function of the electrons which have made transitions from a first quantum energy level to a second quantum energy level.

A photodetector to which the apparatus of the present invention is applicable comprises:

a semiconductor member having a source unit and a drain unit;

a channel unit through which electrons may flow between said source unit and drain unit, which comprises a quantum well layer having a plurality of quantum energy levels and barrier layers provided adjacent to this well layer;

means for applying voltage between the source unit and drain unit; and means for detecting the amount of current flowing between the source unit and drain unit.

Here, upon light irradiation of the quantum well layer, electrons make transitions between different quantum energy levels, and the amount of current flowing between the source unit and drain unit is varied as the mobility of the transitioned electrons changes.

DESCRIPTION OF THE PREFERRED EMBODIMENT

Figure 1A:
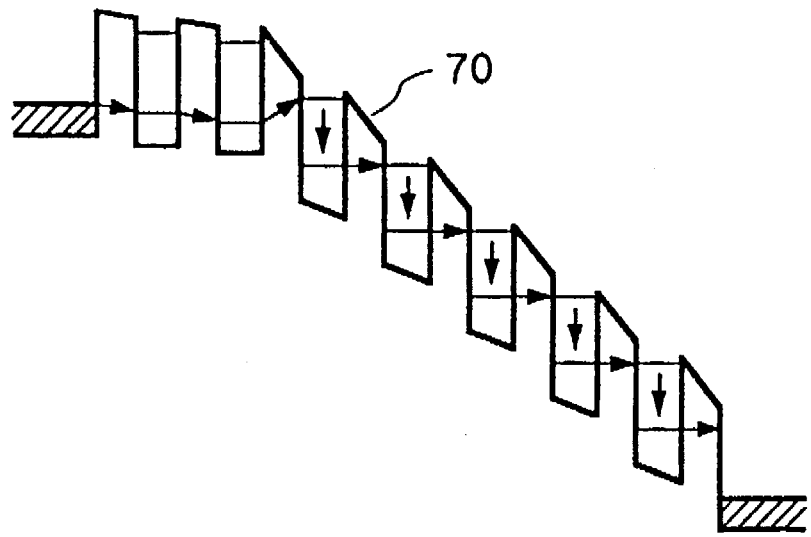
FIG. 1A and FIG. 1B are views of energy bands illustrating the detection principle of a conventional photodetector.
Figure 1B:
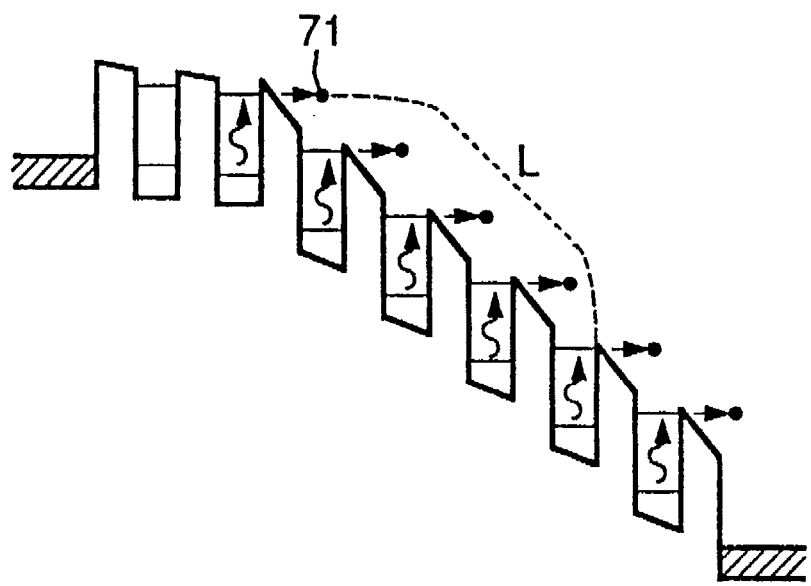
Figure 2:
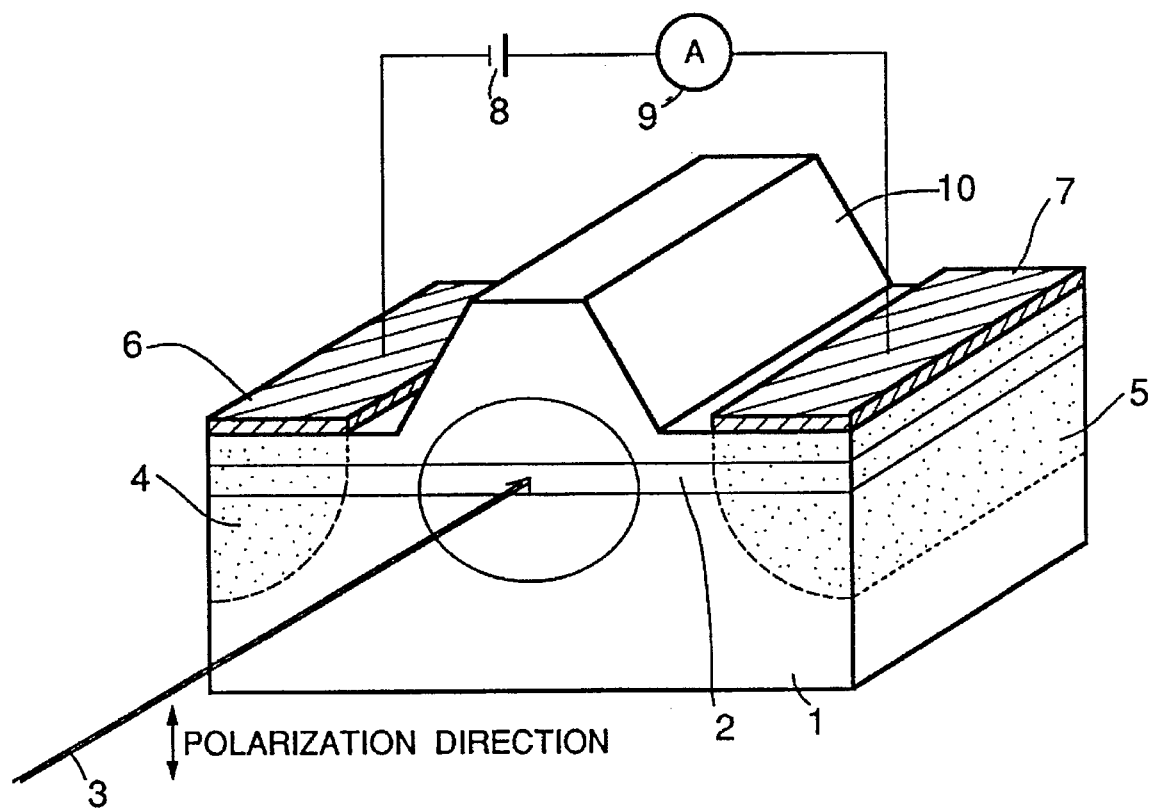
FIG. 2 is a perspective view schematically showing the configuration of a semiconductor according to the present invention.

FIG. 2 is a perspective view schematically showing the configuration of a semiconductor device according to the present invention. In FIG. 2, reference numeral 1 designates a semiconductor substrate. On this substrate 1, channel unit 2, a quantum well structure comprising a plurality of semiconductor layers and semiconductor cap layer 10, are formed. In the center of cap layer 10, a ridge is formed, which extends along the direction of incident light 3. This ridge functions as a waveguide to propagate incident light 3. This ridge is configured by removing part of cap layer 10 by meza-etching after cap layer 10 has been deposited.

Source electrode 6 and drain electrode 7 are formed on either side of the ridge of cap layer 10. Beneath these electrodes, source electrode diffusion area 4 and drain electrode diffusion area 5 are respectively provided. These electrode diffusion areas are provided to allow channel unit 2 and the electrodes to be in contact. The diffusion areas are formed in a manner such that after the electrodes have been formed on cap layer 10, the device is soaked in a constant temperature bath for heating to diffuse electrode-formation metal over cap layer 10, channel unit 2, and a part of substrate 1.

Power source 8 is connected to electrodes 6 and 7 and a voltage is applied across the source and drain. The amount of current flowing between the source and drain is detected by current detector 9. In the channel 2, light 3 is input. This incident light is linearly polarized to a direction parallel to the thickness direction of the semiconductor forming the channel unit, i.e., the direction perpendicular to surface of substrate 1.

Figure 3:
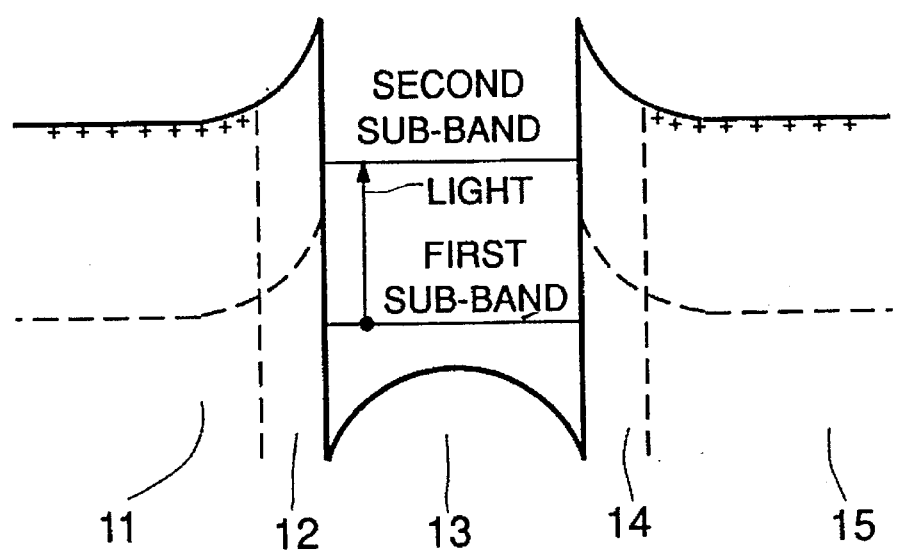
FIG. 3 is a view of an energy band showing the channel unit of a first embodiment of the present invention.

FIG. 3 is a view of an energy band of the conduction band showing the structure of channel unit 2 according to a first embodiment of the present invention. In this embodiment, channel unit 2 is formed by depositing semiconductor layers 11–15 sequentially on substrate 1. The deposition of these semiconductor layers is performed by using, for example, the molecular beam epitaxial system (MBE) or the metal organic chemical vapor deposition system (MO-CVD).

In FIG. 3, reference numerals 11 and 15 designate n type (n—)$Al_xGa_{1-x}As$ barrier layers, the donors of which are doped, and reference numerals 12 and 14 designate intrinsic (i—)$Al_xGa_{1-x}As$ barrier layers, the donors of which are not doped. Reference numeral 13 designates a GaAs quantum well layer.

The composition ratio x between the thickness of quantum well layer 13 and the AlAs content of barrier layers 11, 12, 14, and 15 is defined such that the energy level of the first sub-band of quantum well layer 13 is lower than the energy level of the X band in the k space of the barrier layers, and the energy level of the second sub-band or higher order sub-bands is higher than the energy level of the X band in the k space of the barrier layers. In the present embodiment, the quantum well structure is formed with a GaAs well layer of 50 Å thickness and an AlAs barrier layer with its donor doped to a $10^{18}$ cm$^{-3}$ density (i.e., x=1) to function as an electron channel.

In a structure such as this, as shown in FIG. 2, light polarized in the direction perpendicular to the surface of the quantum well layer, having a photon energy equivalent to the energy between the ground energy level (the first sub-band energy level) and a higher order sub-band energy level (represented as the second sub-band in FIG. 3), is induced into the ridge waveguide structure to be input to channel unit 2. At this juncture, electrons at the ground energy level are partly pumped to a higher order energy level, at a rate depending on the luminous intensity. However, since the X band in the k space of barrier layers 11, 12, 14 and 15 is at a level lower than the pumping energy level of well layer 13, the pumped electrons are relaxed after approximately several hundred picoseconds by the scattering between the bands from the band in the k space of well layer 13 to the X band of the barrier layers while interacting with the photons. Thus, electrons make transitions in the k space to perform the transition in an actual space to travel from well layer 13 to barrier layers 11, 12, 14 and 15.

Here, the effective mass of an electron in well layer 13 differs from the effective mass of an electron in barriers 11–15. For example, the effective mass in the present embodiment is expressed below, with $m_o$ being the electron mass in a vacuum.

The effective mass of electrons in the well layer is given by $m_n{}^r = 0.067\ m_o$.

The effective mass of electrons in the barrier layer is given by $m_n{}^x = (0.85 - 0.07x)m_o$.

Figure 4:
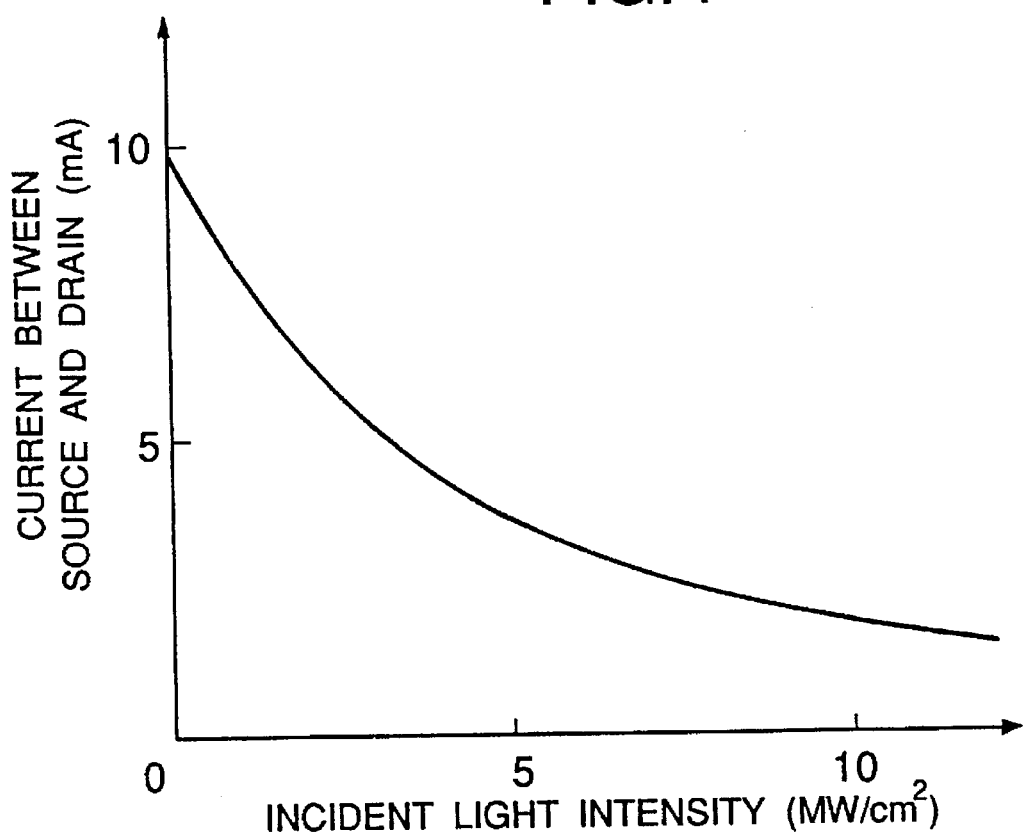
FIG. 4 is a graph showing the relationship between the intensity of incident light and the current between the source and drain in the first embodiment of the present invention.

The mobility of electrons is modulated in an inverse proportion to this effective mass. FIG. 4 is a graph showing the relationship between the current and the mobility of electrons in the present embodiment.

In FIG. 4, the horizontal axis represents the intensity of the incident light, and the vertical axis represents the respective currents between the source and drain. Upon the light irradiation of the device, electrons travel from well layer 13 to the barrier layers. The effective mass of these electrons is heavier than that of those remaining in the well layer. Thus, in response to the intensity of the incident light, the mobility of the electrons is lowered, as is the current, as shown in FIG. 4.

Figure 5:
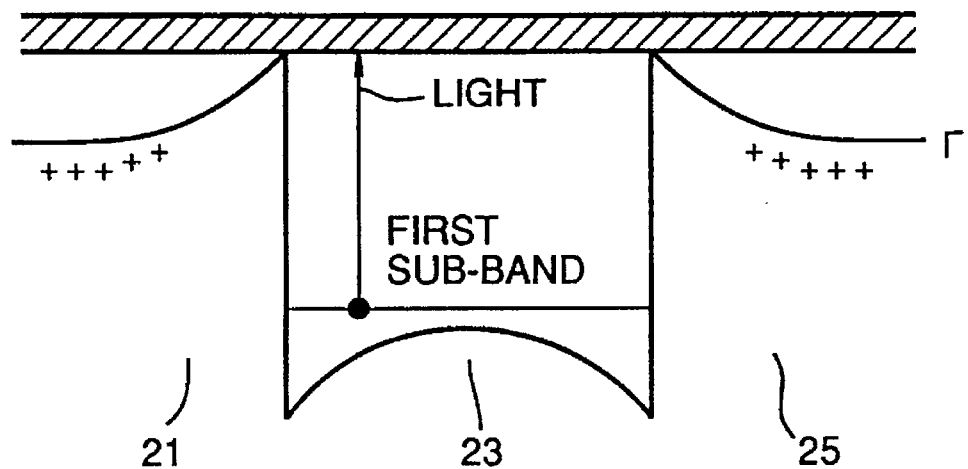
FIG. 5 is a view of an energy band showing the channel unit of a second embodiment of the present invention.

FIG. 5 is a view of an energy band of the conduction band of the channel unit according to a second embodiment of the present invention. The structure is as shown in FIG. 2, with the exception of this channel unit.

In the present embodiment, the channel unit comprises barrier layer 21, quantum well layer 23, and barrier layer 25, sequentially deposited on substrate 1. Here, the X band in the k space of barrier layers 21 and 25 is set at an energy level higher than that of the Γ band in the center of the k space of barrier layers 21 and 25. In other words, barrier layers 21 and 25 are formed directly on the transition semiconductor, and the first sub-band exists in well layer 23.

When light having a photon energy greater than the energy difference between the sub-band and the lowest end of the Γ band of barrier layers 21 and 25, with a polarization direction perpendicular to the surface of the quantum well layer, is input, modulated doping is performed. That is to say, an impurity is doped only to AlGaAs layers 21 and 25 where no electrons exist.

By this configuration, in which electrons are supplied only to GaAs layer 23, the electrons stacked on the well layer are optically pumped to exist partly in the barrier layer.

Here, the effective masses of an electron in the well layer and barrier layers are expressed below, as in the first embodiment.

The effective mass of an electron in the well layer is given by $m_n = 0.067\ m_o$.

The effective mass of an electron in the barrier layer is given by $m_n = (0.067 + 0.083x)m_o$.

Therefore, electrons that make transitions to barrier layers 21 and 25 have an effective mass heavier than those existing in well layer 23. This makes it possible to modulate the mobility by light irradiation, as in the first embodiment. In this way, the current between the source and drain varies.

Figure 6:
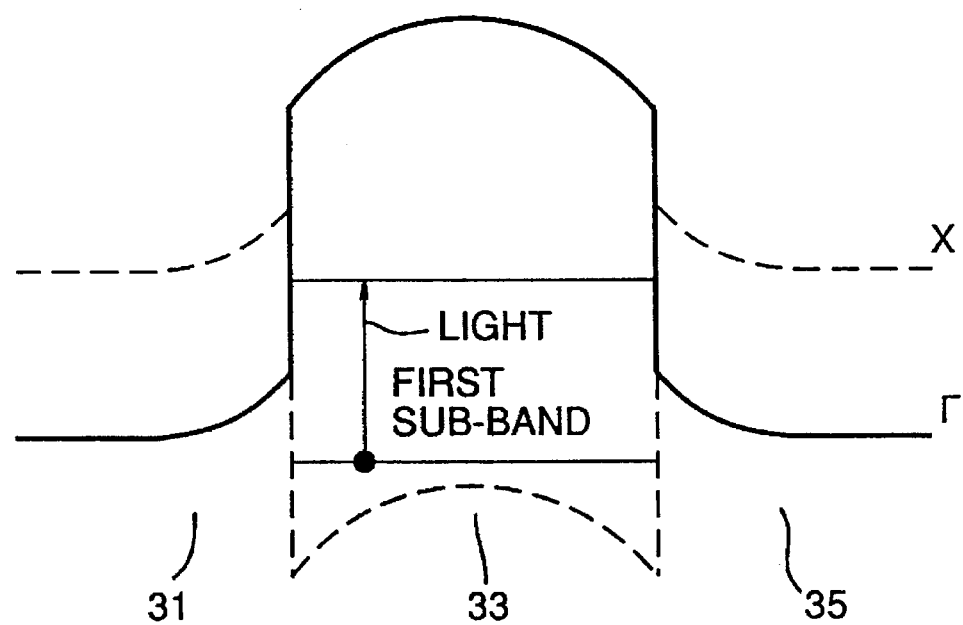
FIG. 6 is a view of an energy band showing the channel unit of a third embodiment of the present invention.

FIG. 6 is a view of an energy band of the conduction band of the channel unit according to a third embodiment of the present invention. The structure is as shown in FIG. 2, with the exception of this channel unit.

In the present embodiment, the channel unit comprises barrier layer 31, quantum well layer 33, and barrier layer 35 sequentially deposited on substrate 1.

In the present embodiment, the bottom of the X band of quantum well layer 33 is set lower than the bottom of the Γ band of quantum well layer 33 and the bottoms of the X band and Γ band of barrier layers 31 and 35, to configure a transistor having the quantum well structure as its channel. As in the first embodiment, the first sub-band of well 33 formed in the X band is lower than the X band and Γ band of barrier layers 31 and 35.

In the AlGaAs system, the above-mentioned band structure can be obtained, for example, by forming quantum well 33 with an AlAs layer and barrier layers 31 and 35 with AlGaAs. This produces a so-called super-lattice of type II having an Al ratio of mixed crystal approximately 0.3 or more, or a GaAs layer of approximately 40 Å or less.

Figure 7:
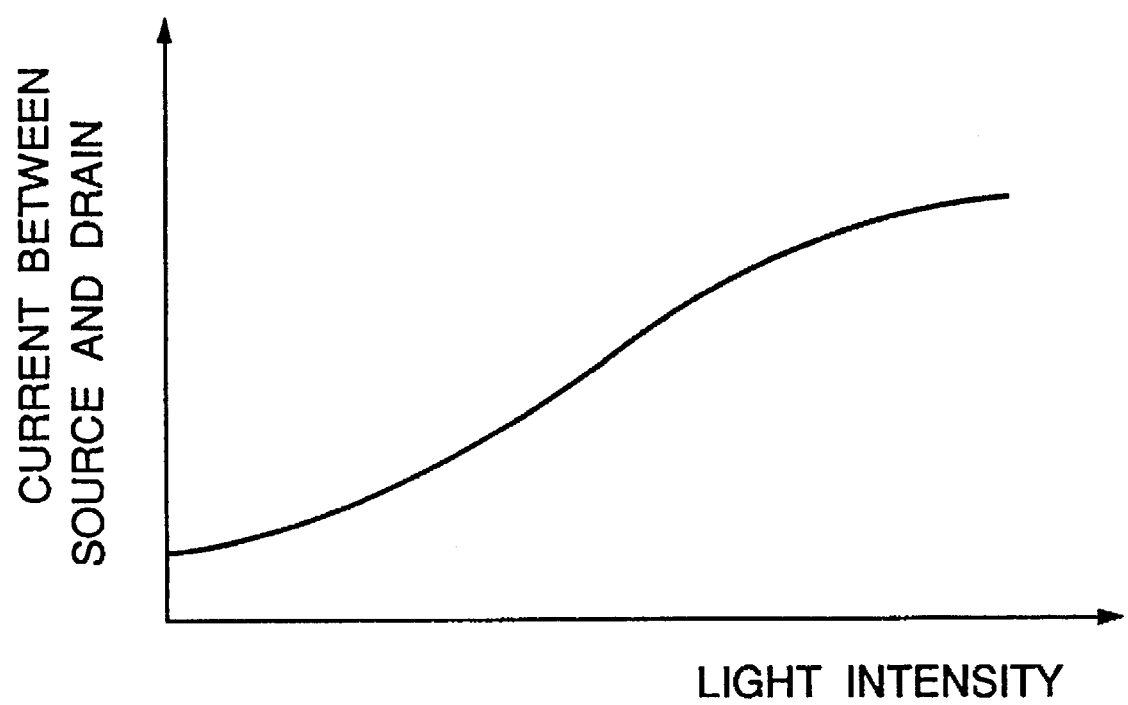
FIG. 7 is a view showing the relationship between the intensity of incident light and the current between the source and drain in the third embodiment of the present invention.

FIG. 7 is a graph showing the relationship between the luminous intensity of the irradiated light and the current between the source and drain in the third embodiment. Since the effective electron mass in barrier layers 31 and 35 is smaller than the effective electron mass in well layer 33, the mobility increases as the luminous intensity increases. Consequently, as is the case in a usual photodiode, the current between the source and drain increases as the luminous intensity increases.

In the embodiments above, the mobility of electrons is varied by causing the electrons pumped by light irradiation to travel from the well layer to the barrier layer. As a result, the response time of the device depends only on the time required for a carrier to make the transition to the pumping energy level between the sub-bands by the irradiated light in the quantum well, the time required for the carrier to make the transition in the actual space or in the k space, and the time required for the pumped carrier to fall to the ground energy level. As these transition times are all on the order of sub-pico seconds, it is possible to implement a photo-semiconductor device capable of performing extremely high-speed responses.

In contrast with this, in the embodiment below, the mobility of electrons is varied utilizing the variation of the spatial distribution of the wave function of the pumped electrons, while arranging in the well layer the areas of different mobilities of electrons flowing therein.

Figure 8:
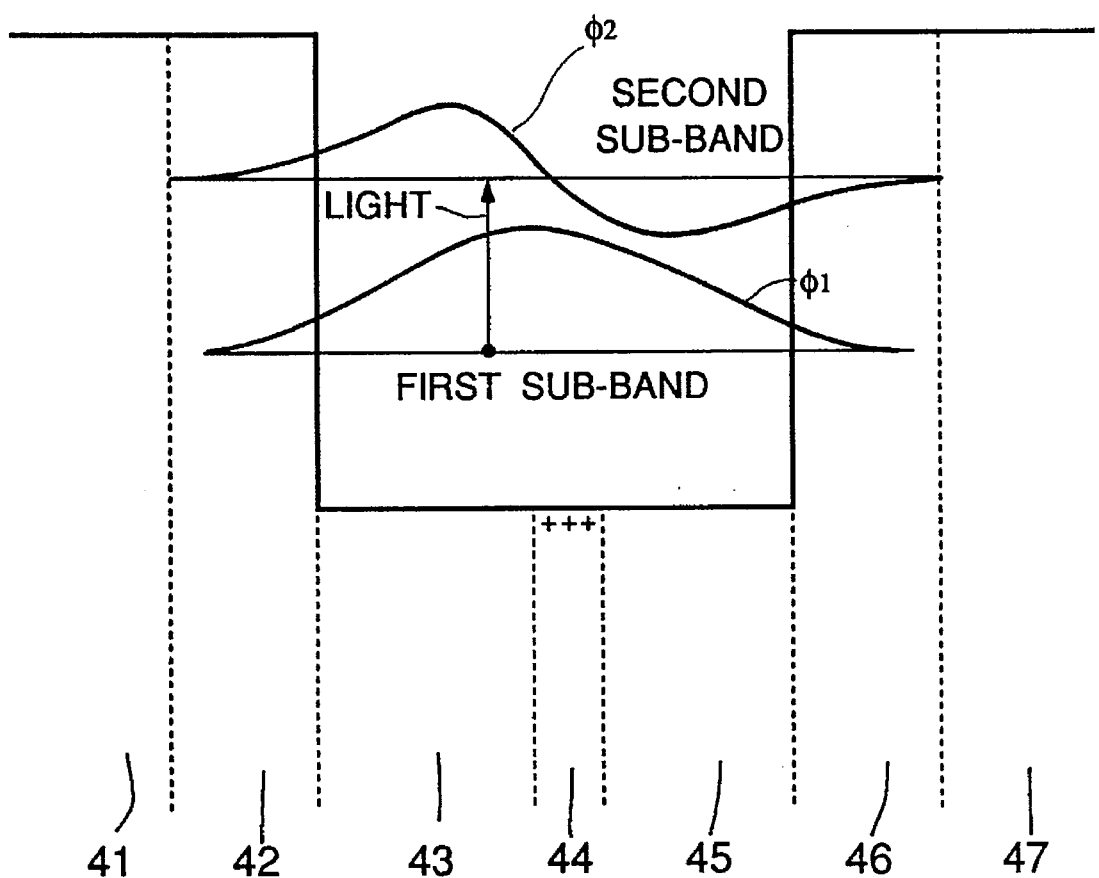
FIG. 8 is a view of an energy band showing the channel unit of a fourth embodiment of the present invention.

FIG. 8 is a view of an energy band showing the structure of the channel unit of a fourth embodiment of the present invention. The structure is as shown in FIG. 2, with the exception of this channel unit.

In FIG. 8, reference numerals 41 and 47 designate n—$Al_xGa_{1-x}As$ layers 500 Å thick, the donors of which have been doped. Reference numerals 42 and 46 designate i—$Al_xGa_{1-x}As$ layers 100 Å thick. Reference numerals 43 and 45 designate non-doped GaAs layers 40 Å thick, while reference numeral 44 designates a δ doped GaAs layer 20 Å thick. Here, the Al ratio of mixed crystal x between the n—$Al_{1-x}Ga_{1-x}As$ layers 41 and 47 and the non-doped i—$Al_xGa_{1-x}As$ layers 42 and 46 is 0.3, and the doping density is $10^{18} cm^{-3}$.

In a structure such as this, as shown in FIG. 2, a light polarized in the direction perpendicular to the surface of the quantum well layer, having photon energy equivalent to the energy between the ground energy level (the first sub-band energy level) and a higher order sub-band level (represented as the second sub-band in FIG. 8), is induced into the ridge waveguide structure, to be input to channel unit 2. At this point, electrons at the ground energy level (the first sub-band) are partly pumped to the pumping energy level (the second sub-band) at a rate depending on the luminous intensity. As shown in FIG. 8, the electron wave function $\phi_1$ in the first sub-band has the distribution of an even function in the quantum well, while the electron wave function $\phi_2$ in the second sub-band has the distribution of an odd function in the quantum well. Therefore, at the ground energy level, the probability of electron existence is high at the position where many donors are distributed (the portion of δ doped GaAs layer 44). At the pumping energy level, by way of contrast, the probability is low at the position where many donors are distributed.

As a result, in the ground state, the mobility of electrons flowing in the direction towards the channel unit is small due to the comparatively great influence of the scattering exerted by the donor. The mobility becomes large in the pumping state where this influence is small. Thus, by light irradiation, the current is modulated in response to its intensity, and it becomes possible to perform the detection of optical signals and the switching of currents between the source and drain by light.

Figure 9:
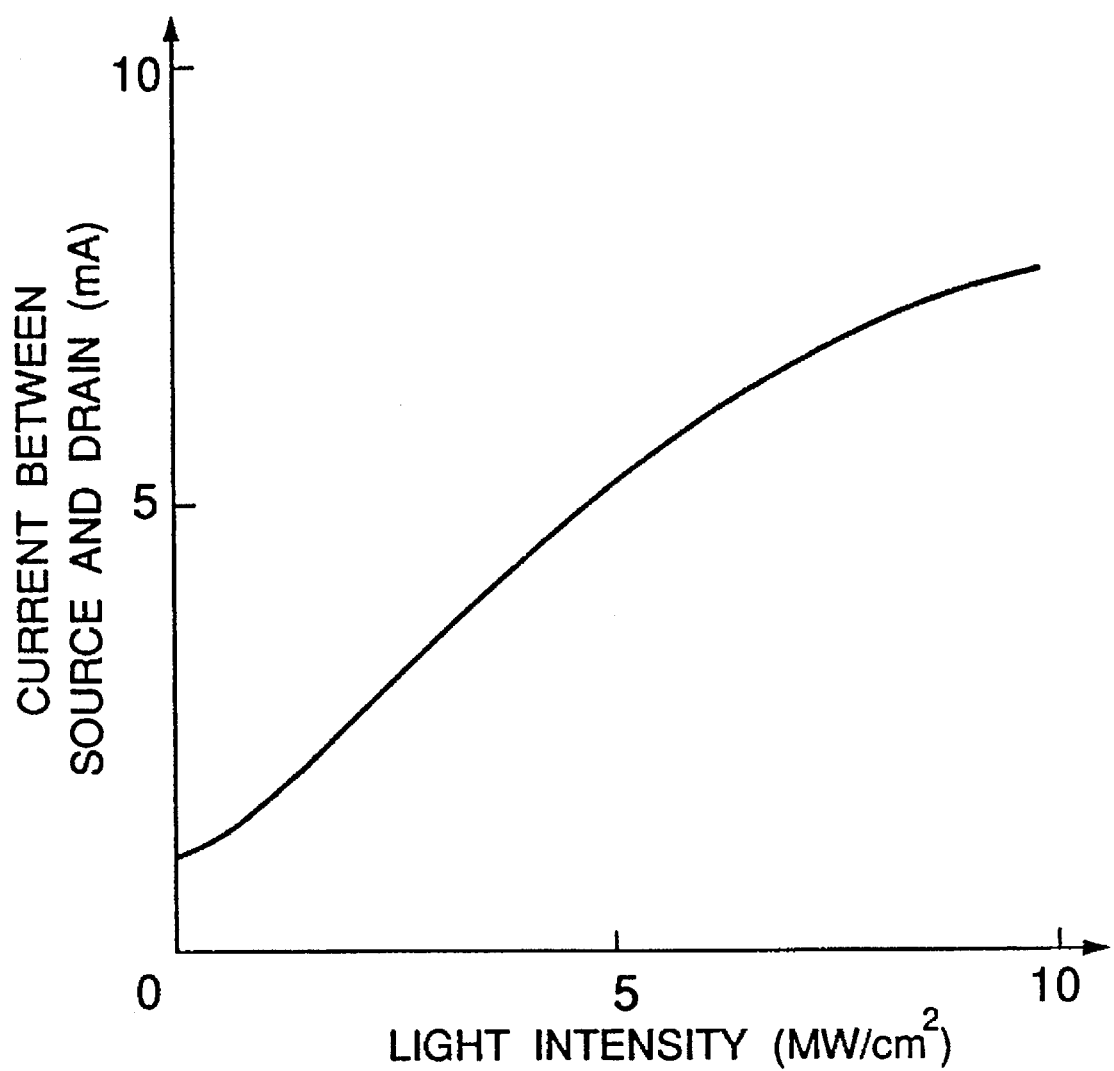
FIG. 9 is a graph showing the relationship between the intensity of incident light and the current between the source and drain in the fourth embodiment of the present invention.

FIG. 9 is a graph showing the relationship between the luminous intensity of the incident light and the current between the source and drain. Here, the current measured is approximately 1 ps after light irradiation. The horizontal axis shows the intensity of the incident light and the vertical axis shows the current between the source and drain. In this way, it is possible to obtain a semiconductor capable of performing the modulation of current at a high speed.

Figure 10:
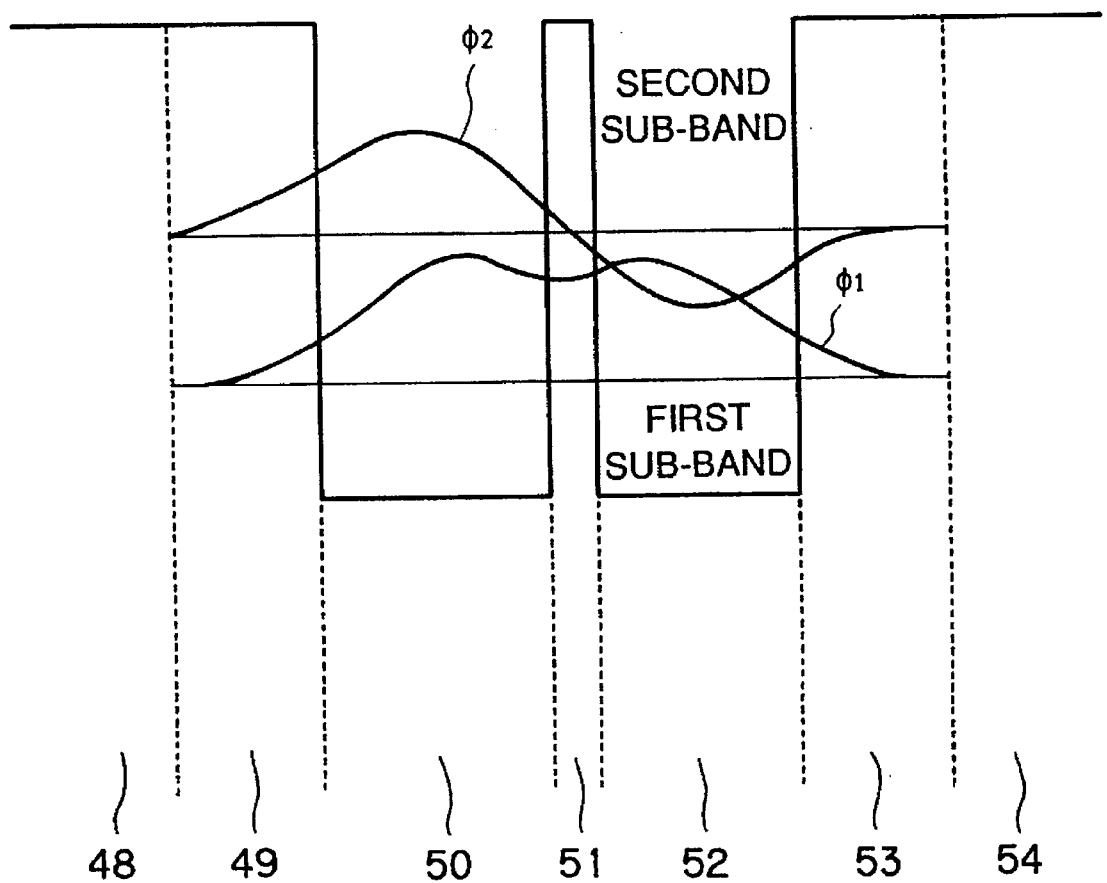
FIG. 10 is a view of an energy band showing the channel unit of a fifth embodiment of the present invention.

FIG. 10 is a view of an energy band showing a fifth embodiment of the present invention. The structure is as shown in FIG. 2, with the exception of this channel unit.

In FIG. 10, reference numerals 48 and 54 designate n—$Al_xGa_{1-x}As$ layers 500 Å thick, the donors of which are doped. Reference numerals 49 and 53 designate non-doped i—$Al_xGa_{1-x}As$ layers 100 Å thick. Reference numerals 50 and 52 designate non-doped GaAs layers 40 Å thick, while reference numeral 51 designates an i—$Al_xGa_{1-x}As$ layer 8 Å thick. The Al ratio x of mixed crystal between n—$Al_xGa_{1-x}As$ layers 48 and 54 and non-doped $Al_xGa_{1-x}As$ layers 49 and 53 is 0.3, and the doping density of the donor is $10^{18}$cm$^{-3}$.

The principle of operation of this device is substantially the same as the fourth embodiment. A light polarized in the direction perpendicular to the surface of the quantum well layer, having photon energy equivalent to the energy between the ground energy level (the first sub-band energy level) and a higher order sub-band energy level (represented as the second sub-band energy in FIG. 10), is induced into the ridge waveguide to be input to channel 2. Electrons at the ground energy level (the first sub-band) are partly pumped to the pumping energy level (the second sub-band). As shown in FIG. 10, the electron wave function $\phi_1$ in the first sub-band has the distribution of an even function in the quantum well and the electron wave function $\phi_2$ in the second sub-band has the distribution of an odd function in the quantum well.

Thus, at ground energy level, the probability of electron existence is high in the i—$Al_xGa_{1-x}As$ layer 51. At the pumping energy level, by way of contrast, the probability is low in the i—$Al_xGa_{1-x}As$ layer 51. As a result, in the ground state, the mobility of electrons flowing in the direction towards the channel is small because its effective mass is comparatively large, while in the pumping state, the mobility of electrons is large. As in the fourth embodiment, high-speed photodetection and switching are possible.

In this embodiment, layer 51 is formed to be sufficiently thin (approximately several Å to 10 Å), so that the electron wave function in GaAs layers 50 and 52 can be distributed in succession. In other words, layers 50 and 52 are formed to figure a single quantum well.

The response speed to optical signals in the fourth and fifth embodiments depends only upon the time required for the charged particles flowing in the channel to perform their transition in the sub-band. As a result, high-speed switching on the order of sub-pico seconds can be performed, making it possible to implement a photo-semiconductor capable of making an extremely high-speed response.

Figure 11:
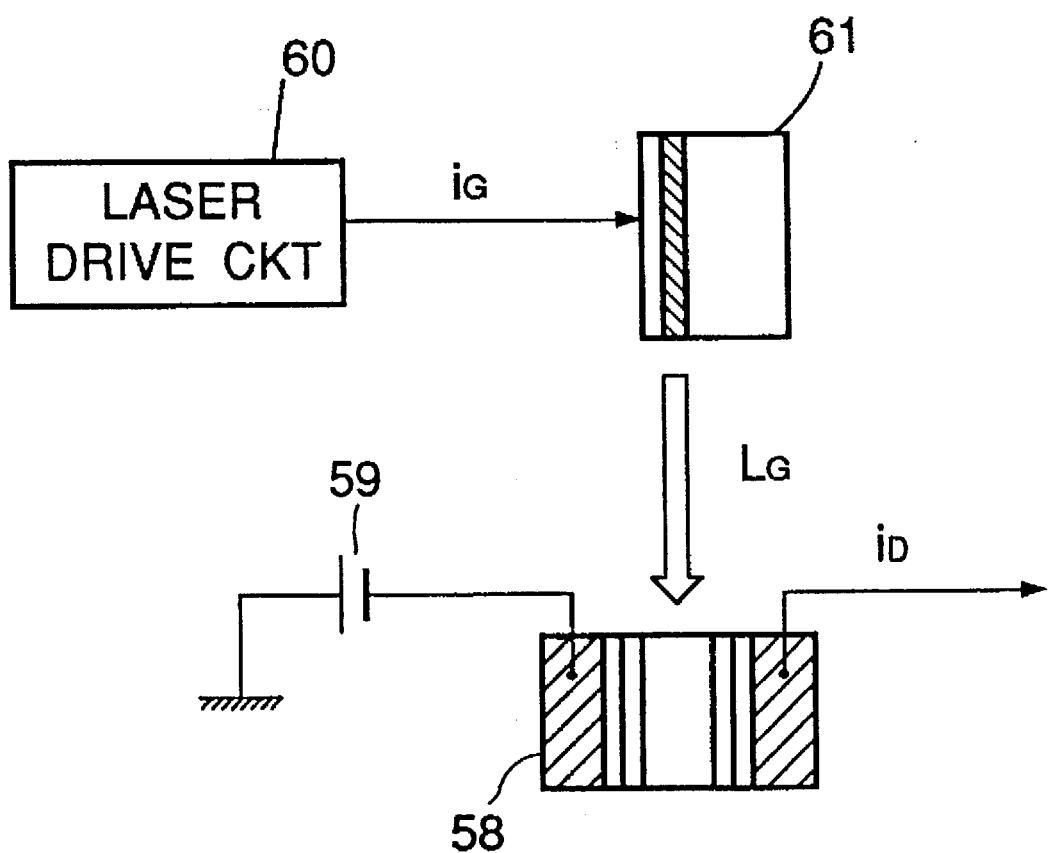
FIG. 11 is a block diagram showing an example in which the device of the present invention is used as an optical gate transistor.

FIG. 11 is a block diagram showing an example in which the present invention is applied to an optical gate transistor.

In FIG. 11, reference numeral 58 is a device such as that shown in FIG. 2. Between the electrodes of this device 58, a voltage is applied by power source 59. Gate light $L_G$ irradiates from laser light source 61. This source can be, for example, a semiconductor laser. By modulating this light $L_G$ with the current $i_G$ supplied to the laser light source from laser driver circuit 60, drain current $i_D$ of device 58 is modulated. If gate light $L_G$ is produced as a pulse light having a pulse width of 1 ps or less, drain current $i_D$ can be modulated at this speed to implement a high-speed current modulator.

Figure 12:
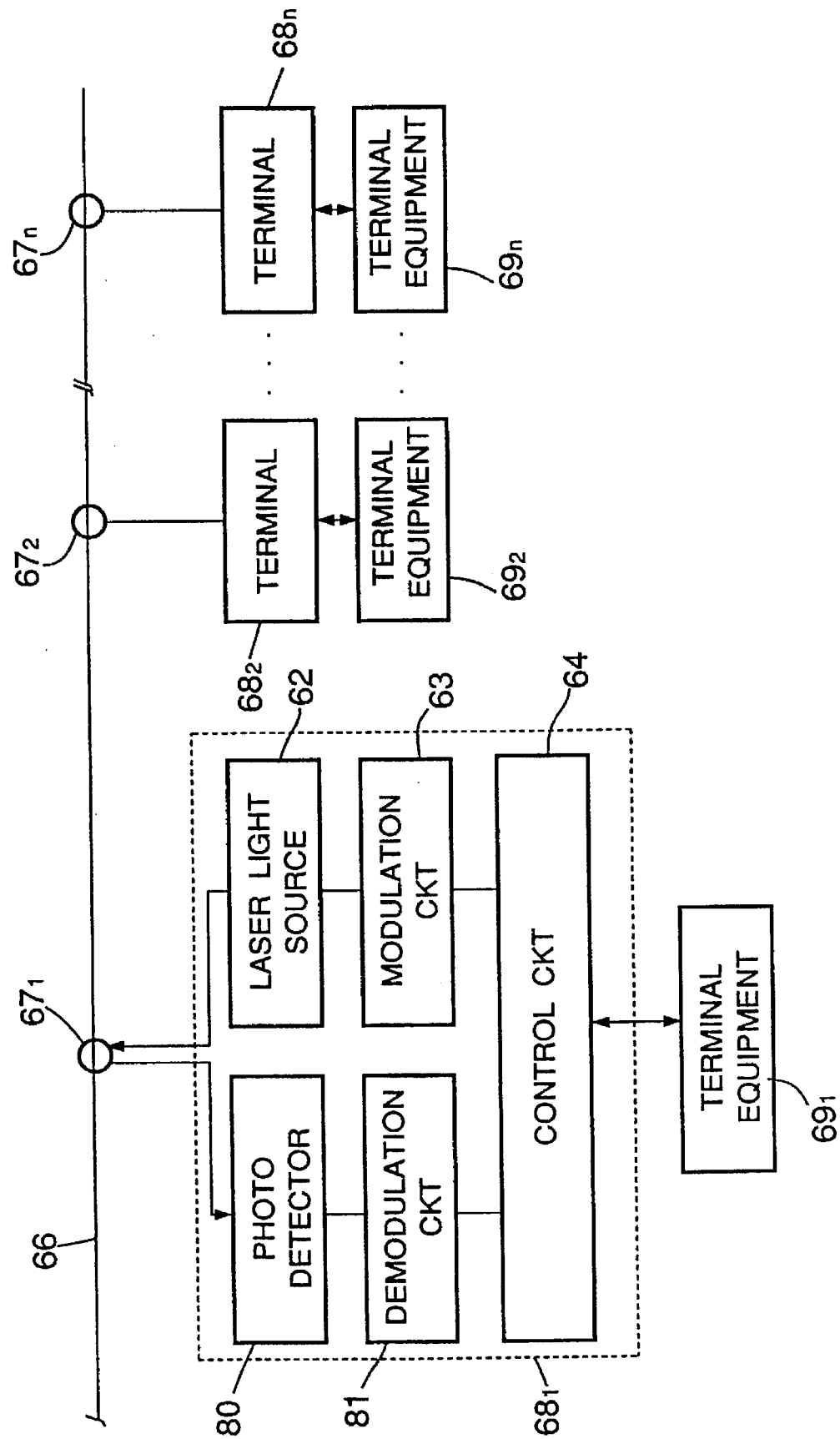
FIG. 12 is a block diagram showing an example in which the device of the present invention is used as a photodetector for an optical communication system.

FIG. 12 is a block diagram illustrating an example in which the semiconductor device of the present invention is used as a photodetector for an optical communication system. In FIG. 12, reference numeral 66 designates optical fiber which transmits optical signals. To this optical fiber 66, a plurality of terminals $68_1, 68_2, \ldots, 68_n$ are connected through respective optical nodes $67_1, 67_2, \ldots, 67_n$. Terminal equipment $69_1, 69_2, \ldots, 69_n$, each with a key board, display element, and other elements, are connected to the respective terminals.

Each terminal is provided with an optical signal transmitter comprising modulation circuit 63 and laser light source 62. Each terminal is further provided with an optical signal receiver comprising photodetector 80 and demodulation circuit 81. These transmitters and receivers are controlled by control circuit 64 in accordance with instructions from terminal equipment $69_1$. An electron wave interference device according to the present invention described in FIG. 2 is suitably employed.

In addition to the embodiments above, it is possible to make various applications according to the present invention. For example, in the embodiments, while the well layer is Sandwiched by the barrier layers, it may be possible to adopt a configuration in which the quantum confinement is effectuated by a single heterointerface. Also, the present invention is applicable not only to the case where the one-dimensional quantum confinement is performed, but also to the case where a two-dimensional quantum confinement is performed by the quantum well layer, i.e., a device of so-called quantum line structure.

Further, although the device is fabricated using AlAs and AlGaAs in the embodiments, it may be possible to fabricate a device using other Group III-V semiconductors, such as InGaAs, or Group II-VI semiconductors, such as ZnMnSe, CdMnTe or Group I-VII semiconductors, such as CuCl. It is to be understood that the present invention includes all such examples of applications mentioned above without departing from the scope of the claims.

What is claimed is:

1. A semiconductor device for controlling a current, said device comprising:

a semiconductor member having a source unit and a drain unit; and a channel unit through which electrons flow between said source unit and said drain unit, said channel unit comprising semiconductor layers including a quantum well layer having a conduction band containing an Γ band and an X band and a plurality of quantum energy levels, and barrier layers adjacent to said quantum well layer, each of said barrier layers having a conduction band containing an Γ band and an X band, said quantum well layer and said barrier layers being formed such that electrons in said quantum well layer have a different mobility from electrons in said barrier layers, and said quantum well layer further being formed such that an energy level of the Γ band is lower than that of the X band and said quantum well layer has a first quantum energy level of the Γ band and a second quantum energy level of the Γ band which is higher than the first quantum energy level, and said barrier layers further being formed such that an energy level of the Γ band therein is higher than that of the X band therein and the X band of said barrier layers has an energy level which is higher than the first quantum energy level of said quantum well layer but lower than the second quantum energy level of said quantum well layer, said quantum well layer being formed so as to be responsive to light such that when light is irradiated onto said quantum well layer at a selected light intensity, a number of electrons in said quantum well layer make transitions from the first quantum energy level to the second quantum energy level and after that the transited electrons flow from said quantum well layer to said barrier layers, said number of transited electrons being in accordance with the selected light intensity and a current flowing through said channel unit varying in accordance with said number of transited electrons, whereby said current is controlled in accordance with the selected light intensity.

2. A semiconductor device according to claim 1, wherein said barrier layer is doped with a donor.

3. A semiconductor device for controlling a current, said device comprising:

a semiconductor member having a source unit and a drain unit; and a channel unit through which electrons flow between said source unit and said drain unit, said channel unit comprising semiconductor layers including a quantum well layer having a conduction band containing an $\Gamma$ band and an X band and a plurality of quantum energy levels, and barrier layers adjacent to said quantum well layer, each of said barrier layers having a conduction band containing an $\Gamma$ band and an X band, said quantum well layer and said barrier layers being formed such that electrons in said quantum well layer have a different mobility from electrons in said barrier layers, and said quantum well layer further being formed such that an energy level of the X band is lower than that of the $\Gamma$ band and said well layer has a first quantum energy level of the X band and a second quantum energy level of the X band which is higher than the first quantum energy level, and said barrier layers further being formed such that an energy level of the X band is higher than that of the $\Gamma$ band, and the $\Gamma$ band of said barrier layers has an energy level which is higher than the first quantum energy level of said quantum well layer but lower than the second quantum energy level of said quantum well layer, said quantum well layer being formed so as to be responsive to light such that when light is irradiated onto said quantum well layer at a selected light intensity, a number of electrons in said quantum well layer make transitions from the first quantum energy level to the second quantum energy level and after that the transited electrons flow from said quantum well layer to said barrier layers, said number of transited electrons being in accordance with the selected light intensity and a current flowing through said channel unit varying in accordance with said number of transited electrons, whereby said current is controlled in accordance with the selected light intensity.

4. A semiconductor device according to claim 3, wherein said barrier layer is doped with a donor.

5. A semiconductor device according to claim 3, wherein a lowest value of the energy level of the X band of said quantum well layer is lower than a lowest value of the energy level of the $\Gamma$ band of said quantum well layer, the lowest value of the energy level of the X band of the barrier layers, and a lowest value of the energy level of the $\Gamma$ band of said barrier layers.

6. A semiconductor device for controlling a current, said device comprising:

a semiconductor member having a source unit and a drain unit; and a channel unit through which electrons flow between said source unit and said drain unit, said channel unit comprising semiconductor layers including a quantum well layer having a conduction band containing a plurality of quantum energy levels, and barrier layers adjacent to said quantum well layer, said quantum well layer further being formed to have a first quantum energy level, a second quantum energy level which is higher than the first quantum energy level, and areas having respective mobilities of electrons therein in a width-wise direction which are different from each other, such that a number of electrons make transitions from the first quantum energy level to the second energy level upon light irradiation of said quantum well layer at a selected light intensity, and a spatial distribution of a wave function of the transited electrons is changed, said number of transited electrons being in accordance with the selected light intensity and a current flowing through said channel unit varying in accordance with said number of transited electrons, whereby said current is controlled in accordance with the selected light intensity.

7. A semiconductor device according to claim 6, wherein the mobility of electrons in said quantum well layer is smaller in a central part thereof than in other portions in the width-wise direction, and electrons have the spatial distribution of the wave function with a distribution of a even function at the first quantum energy level, and have the spatial distribution of a wave function with a distribution of an odd function at the second energy level.

8. A semiconductor device according to claim 7, wherein said quantum well layer is doped with a donor only in a central part in the width-wise direction thereof.

9. A semiconductor device according to claim 7, wherein said quantum well layer comprises a first and a second well layer having an energy gap which is smaller than said barrier layers, and a third well layer sandwiched between said first and second well layers and having an energy gap which is larger than said first and second well layers, and a thickness of said third well layer is formed sufficiently thin so as to enable the wave function of electrons in said first and second well layers to provide a continuous distribution.

10. A semiconductor device according to claim 1, 3 or 6, wherein said device further comprises a source electrode and a drain electrode which are respectively in contact with said source unit and drain unit, and said source unit and said drain unit are formed with areas where metal forming the electrodes is diffused in the semiconductor member.

11. A semiconductor device according to claim 1, 3 or 6, wherein said device further comprises a voltage source for applying voltage between said source unit and said drain unit.

12. A method of controlling current using a semiconductor device comprising a semiconductor member having a source unit and a drain unit, a channel unit through which electrons flow between the source unit and drain unit, the channel unit comprising semiconductor layers including a quantum well layer having a conduction band containing an $\Gamma$ band and an X band and a plurality of quantum energy levels, and barrier layers adjacent to the quantum well layer, each of said barrier layers having a conduction band containing an $\Gamma$ band and an X band, said quantum well layer and said barrier layers being formed such that electrons in said quantum well layer have a different mobility from electrons in said barrier layers, and said method comprising the steps of:

moving electrons to the channel unit by applying a voltage between the source unit and drain unit; and irradiating light onto the quantum well layer of the channel unit, the quantum well layer further being formed such that an energy level of the $\Gamma$ band is lower than that of the X band and the well layer has a first quantum energy level of the $\Gamma$ band and a second quantum energy level of the $\Gamma$ band which is higher than the first quantum energy level, and the barrier layers further being formed such that an energy level of the $\Gamma$ band is higher than that of the X band and the X band of the barrier layers has an energy level higher than the first quantum energy level of the quantum well layer but lower than the second quantum energy level of the quantum well layer, said quantum well layer being formed so as to be responsive to light such that when light is irradiated onto said quantum well layer at a selected light intensity, a number of electrons in said quantum well layer make transitions from the first quantum energy level to the second quantum energy level and after that the transited electrons flow from said quantum well layer to said barrier layers, said number of transited electrons being in accordance with the selected light intensity and a current flowing through the channel unit varying in accordance with said number of transited electrons, whereby said current is controlled in accordance with the selected light intensity.

13. A method of controlling current using a semiconductor device comprising a semiconductor member having a source unit and a drain unit, a channel unit through which electrons flow between the source unit and drain unit, the channel unit comprising semiconductor layers including a quantum well layer having a conduction band containing an $\Gamma$ band and an X band and a plurality of quantum energy levels, and barrier layers adjacent to the quantum well layer, each of said barrier layers having a conduction band containing an $\Gamma$ band and an X band, said quantum well layer and said barrier layers being formed such that electrons in said quantum well layer have a different mobility from electrons in said barrier layers, and said method comprising the steps of:

moving electrons to the channel unit by applying a voltage between the source unit and drain unit; and irradiating light onto the quantum well layer of the channel unit, the quantum well layer further being formed such that an energy level of the X band is lower than that of the $\Gamma$ band and the well layer has a first quantum energy level of the X band and a second quantum energy level of the X band which is higher than the first quantum energy level, and the barrier layers further being formed such that an energy level of the X band is higher than that of the $\Gamma$ band and the $\Gamma$ band of the barrier layers has an energy level which is higher than the first quantum energy level of the well layer but lower than the second quantum energy level of the quantum well layer, said quantum well layer being formed so as to be responsive to light such that when light is irradiated onto said quantum well layer at a selected light intensity, a number of electrons in said quantum well layer make transitions from the first quantum energy level to the second quantum energy level and after that the transited electrons flow from said quantum well layer to said barrier layers, said number of transited electrons being in accordance with the selected light intensity and a current flowing through said channel unit varying in accordance with said number of transited electrons, whereby said current is controlled in accordance with the selected light intensity.

14. A method of controlling current using a semiconductor device comprising a semiconductor member having a source unit and a drain unit, a channel unit through which electrons flow between the source unit and drain unit, the channel unit comprising semiconductor layers including a quantum well layer having a conduction band containing a plurality of quantum energy levels, and barrier layers adjacent to the quantum well layer, said method comprising the steps of:

moving electrons to the channel unit by applying a voltage between the source unit and drain unit; and irradiating light onto the quantum well layer of the channel unit, the quantum well layer further being formed to have a first quantum energy level, a second quantum energy level which is higher than the first quantum energy level, and areas having respective mobilities of electrons therein in a width-wise direction which are different from each other, said quantum well layer being formed so as to be responsive to light such that a number of electrons make transitions from the first quantum energy level to the second quantum energy level upon light irradiation of the well layer at a selected light intensity, and a spatial distribution of a wave function of the transitioned electrons is changed, said number of transited electrons being in accordance with the selected light intensity and a current flowing through the channel unit varying in accordance with said number of transited electrons, whereby said current is controlled in accordance with the selected light intensity.

15. A method according to claim 14, wherein the mobility of electrons in the well layer is smaller in a central part thereof than other portions in the width-wise direction, and electrons have the spatial distribution of a wave function with a distribution of an even function at the first quantum energy level, and a spatial distribution of a wave function with a distribution of an odd function at the second energy level.

16. A method according to claim 12, 13 or 14, wherein light irradiated to the quantum well layer comprises linearly polarized light, a polarization of which is perpendicular to a surface of the quantum well layer.

17. A semiconductor device for controlling a current, said device comprising:

a semiconductor member having a source unit and a drain unit; and a channel unit through which electrons flow between said source unit and said drain unit, said channel unit comprising semiconductor layers including a quantum well layer having a conduction band containing an $\Gamma$ band, an X band, a first quantum energy level and a second quantum energy level which is higher than the first quantum energy level, and barrier layers adjacent to said quantum well layer, each of said barrier layers having a conduction band containing an $\Gamma$ band and an X band, said quantum well layer and said barrier layers being formed such that electrons in said quantum well layer have a different mobility from electrons in said barrier layers, and said quantum well layer further being formed such that an energy level of the $\Gamma$ band is lower than that of the X band and said first and second quantum energy levels are in the Γ band, and said barrier layers further being formed such that an energy level of the Γ band is higher than that of the X band and the X band of said barrier layers has an energy level higher than the first quantum energy level of said quantum well layer but lower then the second quantum energy level of said quantum well layer, said quantum well layer being formed so as to be responsive to light such that when light is irradiated onto said quantum well layer at a selected light intensity, a number of electrons in said quantum well layer make transitions from the first quantum energy level to the second quantum energy level and after that the transited electrons flow from said quantum well layer to said barrier layers in an actual space, said number of transited electrons being in accordance with the selected light intensity and a current flowing through said channel unit varying in accordance with said number of transited electrons, whereby said current is controlled in accordance with the selected light intensity.

18. A semiconductor device for controlling a current, said device comprising:

a semiconductor member having a source unit and a drain unit; and a channel unit through which electrons flow between said source unit and said drain unit, said channel unit comprising semiconductor layers including a quantum well layer having a conduction band containing an Γ band, an X band, a first quantum energy level and a second quantum energy level which is higher than the first quantum energy level, and barrier layers adjacent to said quantum well layer, each of said barrier layers having a conduction band containing an Γ band and an X band, said quantum well layer and said barrier layers being formed such that electrons in said quantum well layer have a higher mobility than electrons in said barrier layers, and said quantum well layer further being formed such that an energy level of the X band is lower than that of the Γ band and the first and second quantum energy levels are in the X band, and said barrier layers further being formed such that an energy level of the X band is higher than that of the Γ band and the Γ band of said barrier layers has an energy level which is higher than the first quantum energy level of said quantum well layer but lower than the second quantum energy level of said quantum well layer, said quantum well layer being formed so as to be responsive to light such that when light is irradiated onto said quantum well layer at a selected light intensity, a number of electrons in said quantum well layer make transitions from the first quantum energy level to the second quantum energy level and after that the transited electrons flow from said quantum well layer to said barrier layers in an actual space, said number of transited electrons being in accordance with the selected light intensity and a current flowing through said channel unit varying in accordance with said number of transited electrons, whereby said current is controlled in accordance with the selected light intensity.

19. A semiconductor device according to claim 18, wherein the lowest value of the energy level of the X band of said quantum well layer is lower than a lowest value of an energy level of the Γ band of said well layer, the lowest value of the energy level of the X band of said barrier layers, and the lowest value of the energy level of the Γ band of said barrier layers.

20. A semiconductor device according to claim 17, 18 or 19, wherein said barrier layer is doped with a donor.

21. A semiconductor device according to claim 17, 18 or 19, wherein said device further comprises a source electrode and a drain electrode which are respectively in contact with said source unit and said drain unit, and said source unit and said drain unit are formed with areas where metal forming the electrodes is diffused in said semiconductor member.

22. A semiconductor device according to claim 17, 18 or 19, wherein said device further comprises a voltage source for applying voltage between said source unit and said drain unit.

23. A method of controlling current using a semiconductor device comprising a semiconductor member having a source unit and a drain unit, a channel unit through which electrons flow between the source unit and the drain unit, the channel unit comprising semiconductor layers including a quantum well layer having a conduction band containing a first energy level and a second energy level which is higher than the first energy level, and barrier layers adjacent to the quantum well layer, said method comprising the steps of:

moving electrons to the channel unit by applying voltage between the source unit and the drain unit; and irradiating light onto the quantum well layer of the channel unit, said quantum well layer and said barrier layers being formed such that electrons in said quantum well layer have a different mobility from electrons in said barrier layers, said quantum well layer being formed so as to be responsive to light such that when light is irradiated onto said quantum well layer at a selected light intensity, a number of electrons in said quantum well layer make transitions from the first quantum energy level to the second quantum energy level and after that the transited electrons flow from said quantum well layer to said barrier layers in an actual space, said number of transited electrons being in accordance with the selected light intensity and a current flowing through said channel unit varying in accordance with said number of transited electrons, whereby said current is controlled in accordance with the selected light intensity.

24. A method according to claim 23, wherein light irradiated to the well layer comprises linearly polarized light, a polarization of which is perpendicular to a surface of the well layer.

25. A semiconductor device for controlling a current, said device comprising:

a semiconductor member having a source unit and a drain unit; and a channel unit through which electrons flow between said source unit and said drain unit, said channel unit having a conduction band containing a first energy level and a second energy level which is higher than the first energy level, and semiconductor layers including a quantum well layer having areas where respective mobilities of electrons flowing therein are different from each other, said quantum well layer being formed so as to be responsive to light such that when light is irradiated onto said quantum well layer at a selected light intensity, a number of electrons in said quantum well layer make transitions from the first quantum energy level to the second quantum energy level and a spatial distribution of a wave function of transitioned electrons is varied, and a current flowing between said source unit and drain unit is controlled by varying the mobilities of the electrons said number of transited electrons being in accordance with the selected light intensity and a current flowing through said channel unit varying in accordance with said number of transited electrons, whereby said current is controlled in accordance with the selected light intensity.

26. A semiconductor device according to claim 25, wherein the mobility of electrons of said well layer is smaller in a central part thereof than other portions in the width-wise direction, and the electrons have a spatial distribution of wave function with a distribution of an even function at the first quantum energy level, and a spatial distribution of a wave function with a distribution of an odd function at the second energy level.

27. A semiconductor device according to claim 26, wherein said quantum well layer is doped with a donor only in a central part in a width-wise direction thereof.

28. A semiconductor device according to claim 26, wherein said well layer comprises a first and a second well layer having an energy gap which is smaller than said barrier layer, and a third layer sandwiched between said first and second well layers having an energy gap which is larger than said first and second well layers, and a thickness of said third well layer is formed sufficiently thin so as to enable the wave function of electrons in said first and second well layers to provide a continuous distribution.

29. A semiconductor device according to claim 25, wherein said device further comprises a source electrode and a drain electrode which are respectively in contact with said source unit and said drain unit, and said source unit and said drain unit are formed with areas where metal forming the electrodes is diffused in the semiconductor member.

30. A semiconductor device according to claim 25, wherein said device further comprises a voltage source for applying voltage between said source unit and said drain unit.

31. A method of controlling current using a semiconductor device comprising a semiconductor member having a source unit and a drain unit, and a channel unit through which electrons flow between the source unit and the drain unit, the channel unit having a conduction band containing first energy level and a second energy level which is higher than the first energy level, and semiconductor layers including a quantum well layer having areas where respective mobilities of electrons flowing therein are different from each other, said method comprising the steps of:

moving electrons to the channel unit by applying voltage between the source unit and the drain unit; and irradiating light onto the quantum well layer of the channel unit, said quantum well layer being formed so as to be responsive to light such that when light is irradiated onto said quantum well layer at a selected light intensity, a number of electrons in said quantum well layer make transitions from the first quantum energy level to the second quantum energy level and a spatial distribution of a wave function of the transitioned electrons is changed, said number of transited electrons being in accordance with the selected light intensity and a current flowing through said channel unit varying in accordance with said number of transited electrons, whereby said current is controlled in accordance with the selected light intensity.

32. A method according to claim 31, wherein the mobility of electrons in the well layer is smaller in a central part thereof than in other portions in the width-wise direction, and the electrons have the spatial distribution of an even function at the first quantum energy level, and a spatial distribution of a wave function with a distribution of an odd function at the second energy level.

33. A method according to claim 31, wherein light irradiated to the well layer comprises linearly polarized light, a polarization of which is perpendicular to a surface of the well layer.

34. A photodetector comprising:

a semiconductor member having a source unit and a drain unit;

a channel unit through which electrons flow between said source unit and drain unit, said channel unit comprising semiconductor layers including a quantum well layer having a conduction band containing a plurality of quantum energy levels and a barrier layer adjacent to said well layer having a k space with an X band;

means for applying voltage between said source unit and said drain unit; and means for detecting an amount of current flowing between said source unit and drain unit, said quantum well layer and said barrier layer being formed such that electrons in said quantum well layer have a different mobility from electrons in said barrier layer, said quantum well layer further being formed to have a first quantum energy level and a second quantum energy level which is higher than the first quantum energy level, and said barrier layer being formed such that the X band in the k space of the barrier layer has an energy level which is higher than the first energy level of said quantum well layer and lower than the second energy level, said quantum well layer being formed so as to be responsive to light such that when light is irradiated onto said quantum well layer at a selected light intensity, a number of electrons in said quantum well layer make transitions from the first quantum energy level to the second quantum energy level and after that the transited electrons flow from said quantum well layer to said barrier layer, said number of transited electrons being in accordance with the selected light intensity and a current flowing through said channel unit varying in accordance with said number of transited electrons, whereby said current is controlled in accordance with the selected light intensity.

35. A photodetector according to claim 34, wherein said barrier layer is doped with a donor.

36. A photodetector comprising:

a semiconductor member having a source unit and a drain unit;

a channel unit through which electrons flow between said source unit and drain unit, said channel unit comprising semiconductor layers including a quantum well layer having a conduction band containing a plurality of quantum energy levels and a barrier layer adjacent to said well layer having a k space with an X band and an $\Gamma$ band;

means for applying voltage between said source unit and said drain unit; and means for detecting an amount of current flowing between said source unit and drain unit, said quantum well layer and said barrier layer being formed such that electrons in said quantum well layer have a different mobility from electrons in said barrier layer, said quantum well layer further being formed to have a first quantum energy level and a second energy level which is higher than the first quantum energy level, and said barrier layer being formed to have an energy level of the X band in the k space of the barrier layer is higher than a highest value of an energy level of the $\Gamma$ band in the k space of said barrier layer and further the $\Gamma$ band in the k space of said barrier layer has an energy level which is higher than the first quantum energy level of said quantum well layer and lower than the second quantum energy level, said quantum well layer being formed so as to be responsive to light such that when light is irradiated onto said quantum well layer at a selected light intensity, a number of electrons in said quantum well layer make transitions from the first quantum energy level to the second quantum energy level and after that the transited electrons flow from said quantum well layer to said barrier layer, said number of transited electrons being in accordance with the selected light intensity and a current flowing through said channel unit varying in accordance with said number of transited electrons, whereby said current is controlled in accordance with the selected light intensity.

37. A photodetector according to claim 36, wherein said barrier layer is doped with a donor.

38. A photodetector according to claim 36, wherein a lowest value of the energy level of the X band of said well layer is lower than the lowest value of the energy level of the $\Gamma$ band of said well layer, the lowest value of the energy level of the X band of said barrier layer, and the lowest value of the energy level of the $\Gamma$ band of said barrier layer.

39. A photodetector comprising:

a semiconductor member having a source unit and a drain unit;

a channel unit through which electrons flow between said source unit and drain unit, said channel unit comprising semiconductor layers including a quantum well layer having a conduction band containing a plurality of quantum energy levels and a barrier layer adjacent to said well layer;

means for applying voltage between said source unit and said drain unit; and means for detecting an amount of current running between said source unit and drain unit, said quantum well layer and said barrier layers being formed such that electrons in said quantum well layer have a different mobility from electrons in said barrier layers, said well layer further being formed to have a first quantum energy level, a second quantum energy level which is higher than the first quantum energy level, and areas having respective mobilities of electrons flowing therein in a width-wise direction which are different from each other, said quantum well layer being formed so as to be responsive to light such that when light is irradiated onto said quantum well layer at a selected light intensity, a number of electrons in said quantum well layer make transitions from the first quantum energy level to the second quantum energy level and a spatial distribution of a wave function of transited electrons is changed, said number of transited electrons being in accordance with the selected light intensity and a current flowing through said channel unit varying in accordance with said number of transited electrons, whereby said current is controlled in accordance with the selected light intensity.

40. A photodetector according to claim 39, wherein the mobility of electrons in said well layer is smaller in a central part thereof than in other portions in a width-wise direction, and electrons have a spatial distribution of wave function with a distribution of an even function at the first quantum energy level, and a spatial distribution of wave function with a distribution of .an odd function at the second energy level.

41. A photodetector according to claim 40, wherein said well layer is doped with a donor only in a central part in the width-wise direction thereof.

42. A photodetector according to claim 40, wherein said well layer comprises first and second well layers having an energy gap which is smaller than said barrier layer, and a third well layer sandwiched between said first and second well layers having an energy gap which is larger than said first and second well layers, and a thickness of said third well layer is formed sufficiently thin so as to enable the wave function of electrons in said first and second well layers to provide a continuous distribution.

43. A photodetector according to claim 34, 36, 38 or 39, wherein said device further comprises a source electrode and a drain electrode which are respectively in contact with said source unit and said drain unit, and said source unit and said drain unit are formed with areas where metal forming the electrodes is diffused in the semiconductor member.

44. A method of detecting light using a semiconductor device comprising a semiconductor member having a source unit and a drain unit, a channel unit through which electrons flow between the source unit and the drain unit, the channel unit comprising semiconductor layers including a quantum well layer having a conduction band containing a plurality of quantum energy levels, and a barrier layer adjacent to the quantum well layer having a conduction band containing an X band with a k space, said method comprising the steps of:

moving electrons to the channel unit by applying voltage between the source unit and the drain unit;

irradiating light onto the quantum well layer of the channel unit, said quantum well layer and said barrier layer being formed such that electrons in said quantum well layer have a different mobility from electrons in said barrier layer; and detecting variations in the amount of current flowing between the source unit and the drain unit, the quantum well layer further being formed to have a first quantum energy level and a second quantum energy level which is higher than the first quantum energy level, and the X band in the k space of the barrier layer having an energy level which is higher than the first energy level of the quantum well layer and lower than the second energy level, said quantum well layer being formed so as to be responsive to light such that when light is irradiated onto said quantum well layer at a selected light intensity, a number of electrons in said quantum well layer make transitions from the first quantum energy level to the second quantum energy level and after that the transited electrons flow from said quantum well layer to said barrier layer, said number of transited electrons being in accordance with the selected light intensity and a current flowing through said channel unit varying in accordance with said number of transited electrons, whereby said current is controlled in accordance with the selected light intensity.

45. A method of detecting light using a semiconductor device comprising a semiconductor member having a source unit and a drain unit, a channel unit through which electrons flow between the source unit and the drain unit, the channel unit comprising semiconductor layers including a quantum well layer having a conduction band including a plurality of quantum energy levels, and a barrier layer adjacent to the well layer having a k space with an X band and an Γ band, said method comprising the steps of:

moving electrons to the channel unit by applying voltage between the source unit and the drain unit;

irradiating light onto the quantum well layer of the channel unit, said quantum well layer and said barrier layer being formed such that electrons in said quantum well layer have a different mobility from electrons in said barrier layer; and detecting variations in the amount of current flowing between the source unit and the drain unit, the quantum well layer further being formed to have a first quantum energy level and a second quantum energy level which is higher than the first quantum energy level, and an energy level of the X band in the k space of the barrier layer being higher than a highest value of an energy level of the Γ band in the k space of the barrier layer and further the Γ band in the k space of the barrier layer having an energy level which is higher than the first quantum energy level of the quantum well layer and lower than the second quantum energy level, said quantum well layer being formed so as to be responsive to light such that when light is irradiated onto said quantum well layer at a selected light intensity, a number of electrons in said quantum well layer make transitions from the first quantum energy level to the second quantum energy level and after that the transited electrons flow from said quantum well layer to said barrier layers, said number of transited electrons being in accordance with the selected light intensity and a current flowing through said channel unit varying in accordance with said number of transited electrons, whereby said current is controlled in accordance with the selected light intensity.

46. A method of detecting light using a semiconductor device comprising a semiconductor member having a source unit and a drain unit, a channel unit through which electrons flow between the source unit and the drain unit, the channel unit comprising semiconductor layers including a quantum well layer having a conduction band containing a plurality of quantum energy levels, and a barrier layer adjacent to the quantum well layer, said method comprising the steps of:

moving electrons to the channel unit by applying voltage between the source unit and the drain unit;

irradiating light onto the quantum well layer of the channel unit; and detecting variations in the amount of current flowing between the source unit and the drain unit, the quantum well layer further being formed such that a first quantum energy level, a second quantum energy level which is higher than the first quantum energy level, and areas having respective mobilities of electrons flowing therein in a width-wise direction which are different from each other, said quantum well layer being formed so as to be responsive to light such that when light is irradiated onto said quantum well layer at a selected light intensity, a number of electrons in said quantum well layer make transitions from the first quantum energy level to the second quantum energy level and a spatial distribution of a wave function of the transitioned electrons is changed, said number of transited electrons being in accordance with the selected light intensity and a current flowing through said channel unit varying in accordance with said number of transited electrons, whereby said current is controlled in accordance with the selected light intensity.

47. A method according to claim 46, wherein the mobility of electrons of the well layer is smaller in a central part thereof than in other portions in the width-wise direction, and electrons have the spatial distribution of a wave function with a distribution of an even function at the first quantum energy level, and a spatial distribution of a wave function with a distribution of an odd function at the second energy level.

48. A method according to claim 44, 45 or 46, wherein light irradiated to the quantum well layer comprises linearly polarized light, a polarization of which is perpendicular to a surface of the quantum well layer.

49. An optical signal receiver in an optical system including an optical signal transmitter and the optical signal receiver, comprising:

a photodetector for receiving optical signals transmitted by the optical signal transmitter; and a demodulator for demodulating signals from an output of said photodetector, the photodetector comprising:

a semiconductor member having a source unit and a drain unit;

a channel unit through which electrons flow between said source unit and drain unit, said channel unit comprising semiconductor layers including a quantum well layer having a conduction band containing a plurality of quantum energy levels and a barrier layer adjacent to said well layer having a k space with an X band;

means for applying voltage between said source unit and said drain unit; and means for detecting an amount of current flowing between said source unit and drain unit, said quantum well layer and said barrier layer being formed such that electrons in said quantum well layer have a different mobility from electrons in said barrier layer, said quantum well layer further being formed to have a first quantum energy level and a second quantum energy level which is higher than the first quantum energy level, and said barrier layer being formed such that the X band in the k space of the barrier layer has an energy level which is higher than the first energy level of said quantum well layer and lower than the second energy level, said quantum well layer being formed so as to be responsive to light such that when light is irradiated onto said quantum well layer at a selected light intensity, a number of electrons in said quantum well layer make transitions from the first quantum energy level to the second quantum energy level and after that the transited electrons flow from said quantum well layer to said barrier layer, said number of transited electrons being in accordance with the selected light intensity and a current flowing through said channel unit varying in accordance with said number of transited electrons, whereby said current is controlled in accordance with the selected light intensity.

50. An optical signal receiver according to claim 49, wherein said barrier layer is doped with a donor.

51. An optical signal receiver in an optical system including an optical signal transmitter and the optical signal receiver, comprising:

a photodetector for receiving optical signals transmitted by the optical signal transmitter; and a demodulator for demodulating signals from an output of said photodetector, the photodetector comprising:

a semiconductor member having a source unit and a drain unit;

a channel unit through which electrons flow between said source unit and drain unit, said channel unit comprising semiconductor layers including a quantum well layer having a conduction band containing a plurality of quantum energy levels and a barrier layer adjacent to said well layer having a k space with an X band and an Γ band;

means for applying voltage between said source unit and said drain unit; and means for detecting an amount of current flowing between said source unit and drain unit, said quantum well layer and said barrier layer being formed such that electrons in said quantum well layer have a different mobility from electrons in said barrier layer, said quantum well layer further being formed to have a first quantum energy level and a second energy level which is higher than the first quantum energy level, and said barrier layer being formed to have an energy level of the X band in the k space of the barrier layer is higher than a highest value of an energy level of the Γ band in the k space of said barrier layer and further the Γ band in the k space of said barrier layer has an energy level which is higher than the first quantum energy level of said quantum well layer and lower than the second quantum energy level, said quantum well layer being formed so as to be responsive to light such that when light is irradiated onto said quantum well layer at a selected light intensity, a number of electrons in said quantum well layer make transitions from the first quantum energy level to the second quantum energy level and after that the transited electrons flow from said quantum well layer to said barrier layer, said number of transited electrons being in accordance with the selected light intensity and a current flowing through said channel unit varying in accordance with said number of transited electrons, whereby said current is controlled in accordance with the selected light intensity.

52. An optical signal receiver according to claim 51, wherein said barrier layer is doped with a donor.

53. An optical signal receiver according to claim 51, wherein a lowest value of the energy level of the X band of said well layer is lower than the lowest value of the energy level of the Γ band of said well layer, the lowest value of the energy level of the X band of said barrier layer, and the lowest value of the energy level of said Γ band of the barrier layer.

54. An optical signal receiver in an optical system including an optical signal transmitter and the optical signal receiver, comprising:

a photodetector for receiving optical signals transmitted by the optical signal transmitter; and a demodulator for demodulating signals from an output of said photodetector, the photodetector comprising:

a semiconductor member having a source unit and a drain unit;

a channel unit through which electrons flow between said source unit and drain unit, said channel unit comprising semiconductor layers including a quantum well layer having a conduction band containing a plurality of quantum energy levels and a barrier layer adjacent to said well layer;

means for applying voltage between said source unit and said drain unit; and means for detecting an amount of current running between said source unit and drain unit, said quantum well layer and said barrier layers being formed such that electrons in said quantum well layer have a different mobility from electrons in said barrier layers, said well layer further being formed to have a first quantum energy level, a second quantum energy level which is higher than the first quantum energy level, and areas having respective mobilities of electrons flowing therein in a width-wise direction which are different from each other, said quantum well layer being formed so as to be responsive to light such that when light is irradiated onto said quantum well layer at a selected light intensity, a number of electrons in said quantum well layer make transitions from the first quantum energy level to the second quantum energy level and a spatial distribution of a wave function of transited electrons is changed, said number of transited electrons being in accordance with the selected light intensity and a current flowing through said channel unit varying in accordance with said number of transited electrons, whereby said current is controlled in accordance with the selected light intensity.

55. An optical signal receiver according to claim 54, wherein the mobility of electrons of said well layer is smaller in a central part thereof than in other portions in the width-wise direction, and electrons have the spatial distribution of a wave function with a distribution of an even function at the first quantum energy level, and the spatial distribution of a wave function with a distribution of an odd function at the second energy level.

56. An optical signal receiver according to claim 55, wherein said well layer is doped with a donor only in a central part in a width-wise direction thereof.

57. An optical signal receiver according to claim 55, wherein said quantum well layer comprises a first and a second well layer each having an energy gap which is smaller than that of said barrier layer, and a third well layer sandwiched between said first and second well layers having an energy gap which is larger than that of said first and second well layers, and a thickness of said third well layer is formed sufficiently thin so as to enable the wave function of electrons in said first and second well layers to provide a continuous distribution.

58. An optical communications system comprising:

an optical transmission line for transmitting optical signals; and a plurality of terminals connected to said optical transmission line, each of the terminals having a photodetector for detecting optical signals transmitted from an optical signal transmitter and other terminals, said photodetector comprising:

a semiconductor member having a source unit and a drain unit;

a channel unit through which electrons flow between said source unit and drain unit, said channel unit comprising semiconductor layers including a quantum well layer having a conduction band containing a plurality of quantum energy levels and a barrier layer adjacent to said well layer having a k space with an X band;

means for applying voltage between said source unit and said drain unit; and means for detecting an amount of current flowing between said source unit and drain unit, said quantum well layer and said barrier layer being formed such that electrons in said quantum well layer have a different mobility from electrons in said barrier layer, said quantum well layer further being formed to have a first quantum energy level and a second quantum energy level which is higher than the first quantum energy level, and said barrier layer being formed such that the X band in the k space of the barrier layer has an energy level which is higher than the first energy level of said quantum well layer and lower than the second energy level, said quantum well layer being formed so as to be responsive to light such that when light is irradiated onto said quantum well layer at a selected light intensity, a number of electrons in said quantum well layer make transitions from the first quantum energy level to the second quantum energy level and after that the transited electrons flow from said quantum well layer to said barrier layer, said number of transited electrons being in accordance with the selected light intensity and a current flowing through said channel unit varying in accordance with said number of transited electrons, whereby said current is controlled in accordance with the selected light intensity.

59. A system according to claim 58, wherein said barrier layer is doped with a donor.

60. An optical communications system comprising:

an optical transmission line for transmitting optical signals; and a plurality of terminals connected to said optical transmission line, each of the terminals having a photodetector for detecting optical signals transmitted from an optical signal transmitter and other terminals, said photodetector comprising:

a semiconductor member having a source unit and a drain unit;

a channel unit through which electrons flow between said source unit and drain unit, said channel unit comprising semiconductor layers including a quantum well layer having a conduction band containing a plurality of quantum energy levels and a barrier layer adjacent to said well layer having a k space with an X band and an $\Gamma$ band;

means for applying voltage between said source unit and said drain unit; and means for detecting an amount of current flowing between said source unit and drain unit, said quantum well layer and said barrier layer being formed such that electrons in said quantum well layer have a different mobility from electrons in said barrier layer, said quantum well layer further being formed to have a first quantum energy level and a second energy level which is higher than the first quantum energy level, and said barrier layer being formed to have an energy level of the X band in the k space of the barrier layer is higher than a highest value of an energy level of the $\Gamma$ band in the k space of said barrier layer and further the $\Gamma$ band in the k space of said barrier layer has an energy level which is higher than the first quantum energy level of said quantum well layer and lower than the second quantum energy level, said quantum well layer being formed so as to be responsive to light such that when light is irradiated onto said quantum well layer at a selected light intensity, a number of electrons in said quantum well layer make transitions from the first quantum energy level to the second quantum energy level and after that the transited electrons flow from said quantum well layer to said barrier layer, said number of transited electrons being in accordance with the selected light intensity and a current flowing through said channel unit varying in accordance with said number of transited electrons, whereby said current is controlled in accordance with the selected light intensity.

61. A system according to claim 60, wherein said barrier layer is doped with a donor.

62. A system according to claim 60, wherein a lowest value of the energy level of the X band of said well layer is lower than the lowest value of the energy level of the $\Gamma$ band of said well layer, the lowest value of the energy level of the X band of said barrier layer, and the lowest value of the energy level of the $\Gamma$ band of said barrier layer.

63. An optical communications system comprising:

an optical transmission line for transmitting optical signals; and a plurality of terminals connected to said optical transmission line, each of the terminals having a photodetector for detecting optical signals transmitted from an optical signal transmitter and other terminals, said photodetector comprising:

a semiconductor member having a source unit and a drain unit;

a channel unit through which electrons flow between said source unit and drain unit, said channel unit comprising semiconductor layers including a quantum well layer having a conduction band containing a plurality of quantum energy levels and a barrier layer adjacent to said well layer;

means for applying voltage between said source unit and said drain unit; and means for detecting an amount of current running between said source unit and drain unit, said quantum well layer and said barrier layers being formed such that electrons in said quantum well layer have a different mobility from electrons in said barrier layers, said well layer further being formed to have a first quantum energy level, a second quantum energy level which is higher than the first quantum energy level, and areas having respective mobilities of electrons flowing therein in a width-wise direction which are different from each other, said quantum well layer being formed so as to be responsive to light such that when light is irradiated onto said quantum well layer at a selected light intensity, a number of electrons in said quantum well layer make transitions from the first quantum energy level to the second quantum energy level and a spatial distribution of a wave function of transited electrons is changed, said number of transited electrons being in accordance with the selected light intensity and a current flowing through said channel unit varying in accordance with said number of transited electrons, whereby said current is controlled in accordance with the selected light intensity.

64. A system according to claim 63, wherein the mobility of electrons of said well layer is smaller in a central part thereof than in other portions in the width-wise direction, and electrons have a spatial distribution of a wave function with a distribution of an even function at the first quantum energy level, and a spatial distribution of a wave function with a distribution of an odd function at the second energy level.

65. A system according to claim 64, wherein said well layer is doped with a donor only in the central part in the width-wise direction thereof.

66. A system according to claim 64, wherein said well layer comprises a first and a second well layer having an energy gap which is smaller than said barrier layer, and a third well layer sandwiched between said first and second well layers having an energy gap which is larger than said first and second well layers, and a thickness of said third well layer is formed sufficiently thin so as to enable the wave function of electrons in a said first and second well layers to provide a continuous distribution.

* * * * *